Sept. 28, 1965 M. V. SCHNEIDER 3,209,291

LOW INDUCTANCE DIODE MOUNTING

Filed May 17, 1963 4 Sheets-Sheet 1

INVENTOR
M. V. SCHNEIDER
BY
Sylvan Sherman
ATTORNEY

Sept. 28, 1965 M. V. SCHNEIDER 3,209,291

LOW INDUCTANCE DIODE MOUNTING

Filed May 17, 1963 4 Sheets-Sheet 2

Sept. 28, 1965 M. V. SCHNEIDER 3,209,291

LOW INDUCTANCE DIODE MOUNTING

Filed May 17, 1963 4 Sheets-Sheet 3

Sept. 28, 1965 M. V. SCHNEIDER 3,209,291
LOW INDUCTANCE DIODE MOUNTING
Filed May 17, 1963 4 Sheets-Sheet 4

United States Patent Office 3,209,291

Patented Sept. 28, 1965

3,209,291
LOW INDUCTANCE DIODE MOUNTING

Martin V. Schneider, Middletown, N.J., assignor to Bell Telephone Laboratories, Incorporated, New York, N.Y., a corporation of New York Filed May 17, 1963, Ser. No. 281,270
11 Claims. (Cl. 333—84)

This invention relates to electromagnetic wave devices and, more particularly, to methods for mounting circuit elements in strip transmission lines.

The problem of minimizing the spurious reactances associated with a circuit element and, in particular, with a diode mounted in a transmission line has been considered by many workers in the art. The techniques employed consist in either tuning out the undesired reactance, as taught by W. M. Sharpless in United States Patent 2,956,160, or in incorporating the diode into the waveguiding structure as taught by B. C. De Loach, Jr., in United States Patent No. 3,050,689.

Sharpless, in the above-mentioned patent, discloses a diode cartridge and cartridge holder which tunes the spurious reactance at the operating frequency. The resulting structure is, accordingly, frequency sensitive. The De Loach structure is for use in waveguides. In addition, both of the above-mentioned patents relate to means for minimizing diode capacitance.

The importance of developing diode mounting arrangements for reducing the diode series inductance has also been considered by many authors. To date, however, no simple, satisfactory method has been disclosed. Nor has there been developed a satisfactory low inductance mounting arrangement for other lumped circuit elements such as thermistors and barretters.

It is, accordingly, an object of this invention to mount, without terminating the line, a lumped circuit element in a strip transmission line so as to introduce a minimum amount of series inductance.

It is a further object of the invention that such mounting arrangements be broadband in their operation.

In accordance with one embodiment of the invention, the circuit element is built directly into the center conductor of a balanced strip transmission line by cutting a hole in the center conductor and placing the element within the hole. One terminal or side of the element is electrically connected to the center conductor and the other terminal or side is electrically connected to each of the outer ground conductors by means of a transversely extending post which passes through the hole in the center conductor.

When a diode, which has a rectifying barrier, is used, similar connections are made. That is, one side of the rectifying barrier is electrically connected to the center conductor of the line, and the other side of the rectifying barrier is electrically connected to each of the outer ground conductors by means of a transversely extending post. Advantageously, in each instance the circuit element is located in the center of the transmission line.

It is a feature of the invention that a low inductance, balanced mounting can be achieved with the use of only one circuit element.

In one illustrative embodiment of the invention involving a diode, a semiconducting sphere is used to fill the hole in the center conductor. A rectifying connection is made between the sphere and the center conductor about the entire periphery of the hole. Posts, extending from each of the ground planes make ohmic connection with the upper and lower portions of the sphere.

In another illustrative embodiment of the invention, also involving a diode, a semiconducting sphere is placed in a square hole in the center conductor and rectifying connection is made between the sphere and the center conductor at four points.

In still another embodiment of the invention, two circuit elements, connected to the opposite edges of the center conductor, are used to further reduce the total series inductance.

These and other objects and advantages of the present invention, and its various features, will appear more fully upon consideration of the various illustrative embodiments now to be described in detail in connection with the accompanying drawings, in which.

Figure 9A:
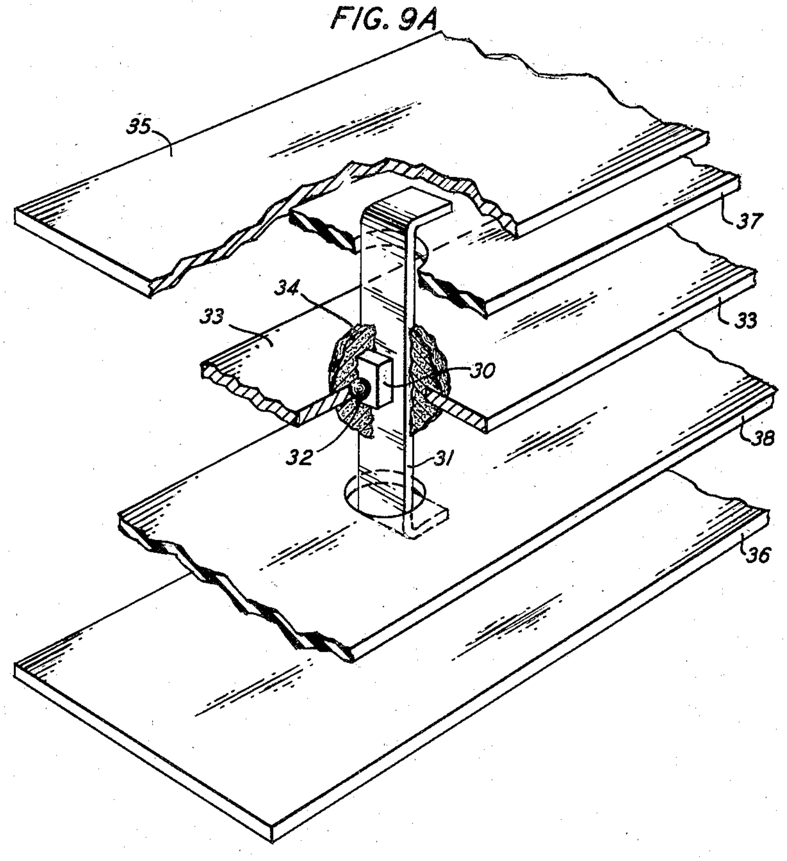
Figure 9B:
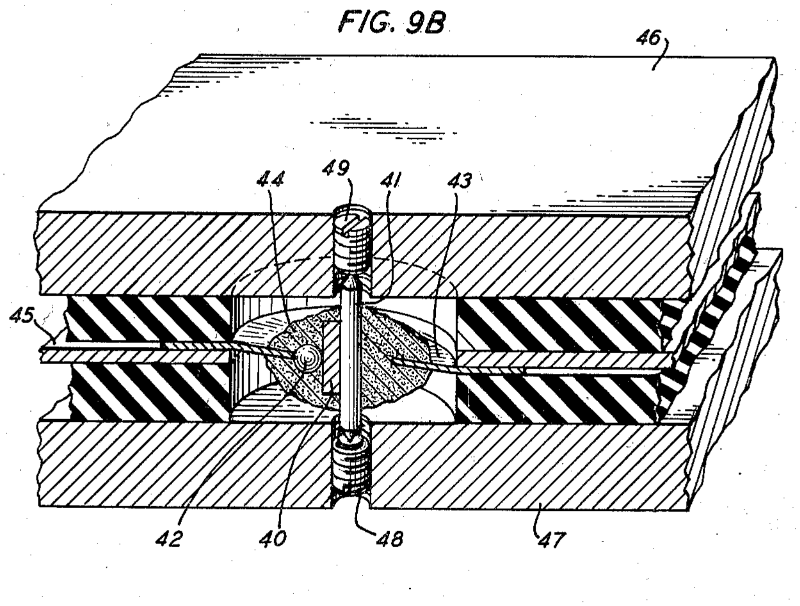
Figure 10:
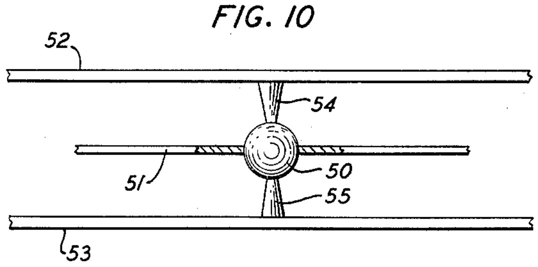
Figure 11:
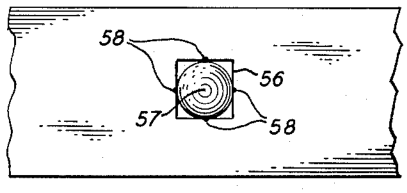
Figure 12:
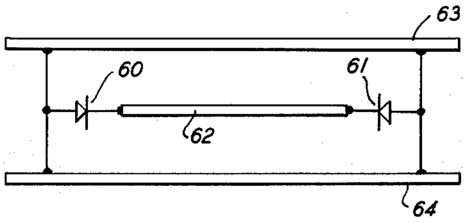
Figure 13:
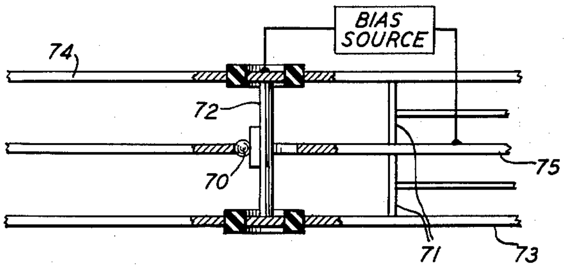

FIGS. 3 through 8, given for purposes of explanation, show various types of mountings;

FIGS. 9A and 9B show in greater detail diodes mounted in accordance with the invention;

FIGS. 10 and 11 show alternate embodiments of the invention;

FIG. 12 shows another embodiment of the invention using two circuit elements; and FIG. 13 shows a diode mounted in accordance with the invention used in connection with a movable short.

Figure 1:
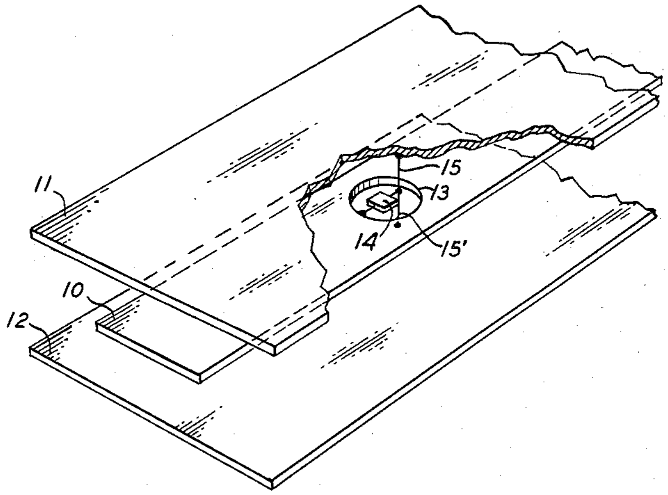
FIG. 1 shows in perspective a circuit element mounted in a strip transmission line in accordance with the invention.

Referring to FIG. 1, there is shown a circuit element mounted in a balanced strip transmission line in accordance with the invention. The strip transmission line comprises an inner, planar conductor 10 and two, equally spaced outer, or ground, planar conductors 11 and 12. The outer conductors 11 and 12 are conductively insulated from the inner conductor 10 by means of layers of dielectric material (not shown) placed between the several conductors in a manner well known in the art.

In accordance with the invention, a hole 13 is cut in the inner conductor 10 and a circuit element 14, represented symbolically, is inserted within the hole. Preferably hole 13 has its center along the longitudinal axis of the line.

One terminal of element 14, which may be a thermistor, a diode or any other two terminal lumped circuit element, is electrically connected to the center conductor 10. The other terminal of element 14 is electrically connected to each of the outer ground conductors 11 and 12 by means of leads (or posts) 15 and 15', respectively, which extend transversely across the line.

When a diode, which may typically have a point contact rectifying barrier, a p-n junction rectifying barrier, or a surface rectifying barrier, is used, one side of the rectifying barrier is electrically connected to the center conductor 10. The other side of the rectifying barrier is electrically connected, as before, to the upper and lower ground conductors 11 and 12 by means of the posts 15 and 15'.

The element is made mechanically rigid by filling the remaining portion of the hole with a small drop of epoxy.

Figure 2:
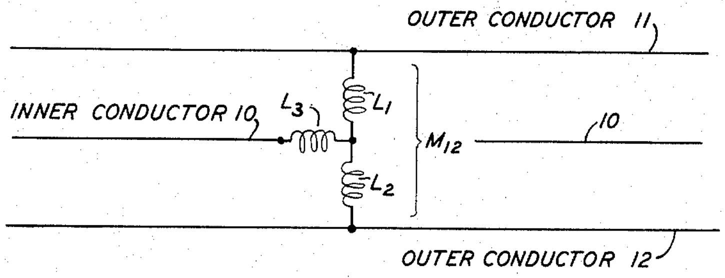
FIG. 2 shows the equivalent inductance of an element mounted as shown in FIG. 1.

FIG. 2 shows the equivalent inductance of a circuit element mounted as described above. It includes an inductance $L_3$, a pair of parallel-connected inductors $L_1$ and $L_2$ and a mutual inductance $M_{12}$ between $L_1$ and $L_2$. $L_3$ represents the inductance of the element itself and any lead inductance between the element and the center conductor 10 and between the element and the junction of leads 15 and 15'. $L_1$ and $L_2$ represent the inductance of leads 15 and 15'. $M_{12}$ represents the mutual inductance between leads 15 and 15'. Because of the direction of current flow in leads 15 and 15', the effect of the mutual inductance $M_{12}$ is to reduce the net inductance as represented by the parallel combination of $L_1$ and $L_2$.

The inductance L of a post in a strip transmission line can be approximated to an order of magnitude by means of the following equation $$L=\frac{\mu_0 h}{2\pi}\ln\frac{w}{d} \quad (1)$$

Figure 3:
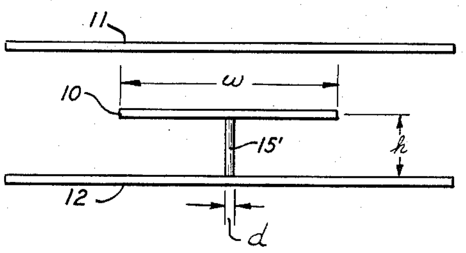
Figure 4:
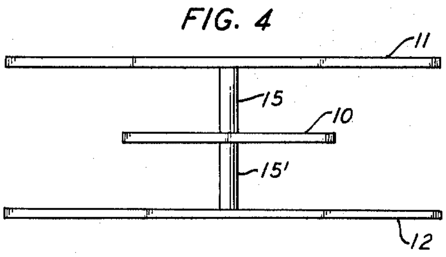

Referring to FIG. 3, $h$ is the distance between the center conductor 10 and one of the ground conductors 12, $w$ is the width of the center conductor, and $d$ is the diameter of the post 15'. For $h$ equal to 150 mils, $w$ equal to 430 mils and $d$ equal to 44 mils, L computes to be 1.76 nanohenries. By the addition of a second post 15 (from center conductor 10 to the upper ground conductor 11) in parallel with post 15', the inductance, as computed by Equation 1, is halved.

There is, however, a further reduction in the net inductance when two posts are used due to the interaction between them. To illustrate this point, measurements were made for different post arrangements as illustrated in FIGS. 3 through 8. The table below gives the measured inductances.

| Figure: | Inductance in nanohenries ($10^{-9}h$) |
|---|---|
| 3 | 1.90 |
| 4 | 0.67 |
| 5 | 2.10 |
| 6 | 1.16 |
| 7 | 1.05 |
| 8 | 0.20 |

Figure 5:
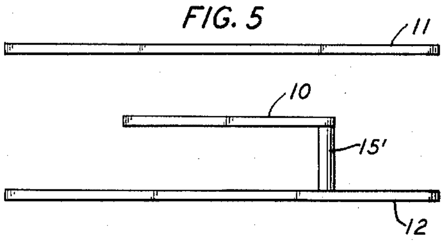
Figure 6:
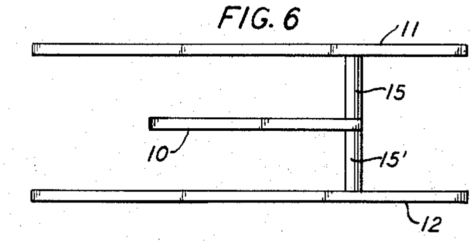
Figure 7:
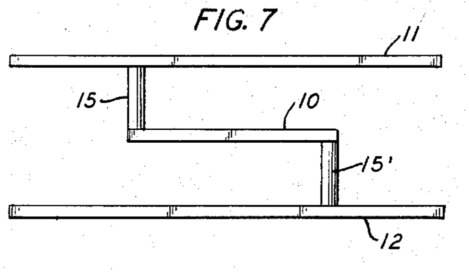
Figure 8:
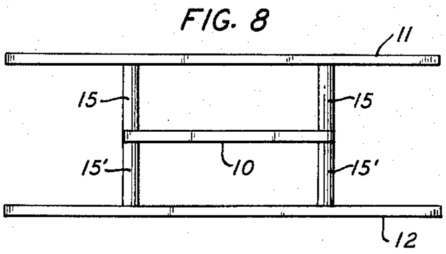

It will be noted that for each arrangement the use of two posts in a balanced configuration results in a reduction in inductance as compared to a single post. Furthermore, in each instance a symmetrical arrangement gives better results than an asymmetrical arrangement. (Symmetry, as measured herein, is measured with respect to a vertical plane through the center of the line.) For example, the inductance of each of the single post structures shown in FIGS. 3 and 5 is greater than the inductance of each of the double-post structures in FIGS. 4 and 6. Similarly, the inductance of each of the asymmetric structures of FIGS. 6 and 7 is greater than the inductance of the symmetric structure of FIG. 4. Finally, it will be noted that the balanced, symmetrical arrangement of FIG. 8, using a pair of double posts connected to transversely opposite edges of the center conductor, results in the lowest inductance of all the structures.

The measurements described above were made using a continuous center conductor to which the posts were mounted. In such an arrangement, the mutual inductance between posts is minimized by the shielding effect of the center conductor. In accordance with the invention the effect of the mutual inductance is enhanced by cutting a hole in the center conductor and placing the diode in the hole. The hole permits enhanced interaction between posts. This technique is utilized in the structure shown in FIG. 1.

FIG. 9A is an exploded view of a diode mounted in a balanced strip transmission line, in accordance with the invention, showing in greater detail one type of diode structure. In this embodiment a semiconducting wafer 30, which for purpose of illustration may be gallium arsenide (GaAs), is soldered, or alloyed, to a gold ribbon 31 to form a nonrectifying back connection. A metallic pellet 32 of tin is alloyed to wafer 30 to form the diode. The diode assembly is then placed in a hole in center conductor 33. The tin pellet is soldered to the center conductor which had previously been tinned. The diode is made mechanically rigid by filling the rest of the hole with a small drop of epoxy 34.

Electrical connection with the upper and lower ground conductors 35 and 36 is made by extending the gold ribbon 31 through holes in the dielectric spacers 37 and 38. In the embodiment shown in FIG. 9A, the ends of the ribbon are bent so as to make pressure contact with the ground conductors when the line is assembled.

In FIG. 9B, which is a slightly modified arrangement of the embodiment of FIG. 9A, the semiconductor wafer 40 is soldered or alloyed to a round or oval thin post 41 to form the nonrectifying back connection. A pellet 42 of suitable material is alloyed to wafer 40, as before, to form the rectifying barrier in the diode. The wafer and pellet are then inserted in a hole in a thin copper strip 43 and the pellet soldered to a tinned edge of the copper strip. As before, a drop of epoxy 44 is used to fill up the remaining area of the hole making a mechanically rigid diode package.

The diode is mounted in a hole in the center conductor 45 of the strip transmission line as shown in FIG. 9B. The copper strip 43, containing the diode, is pressed between the dielectric spacers and the center conductor 45. The metal post 41, which extends transversely across the line, makes contact with the upper and lower ground conductors 46 and 47, respectively. In this embodiment the regions of the ground conductors immediately above and below the diode are made of a soft metal such as indium. When the line is assembled, the post 41 imbeds itself in the indium. A convenient way of doing this is to provide an indium-tipped screw in each of the ground conductors in line with post 41. Such an arrangement is shown in FIG. 9B wherein screw 48 is in the lower ground conductor 47 directly below post 41 and screw 49 is in the upper ground conductor 46 directly above the post. After assembling the line and with the diode in position, the screws are threaded inward, towards the center of the line until they engage post 41 as indicated in the figure.

Whereas the arrangement described above substantially reduces the inductance of the leads connecting the diode to the ground conductors, it does nothing to reduce the inductance of the diode itself which now represents an increased percentage of the total inductance. To reduce the diode inductance (and, in addition, the diode resistance) a ring rectifying contact is made in the alternate embodiment of the invention shown in FIG. 10. In this embodiment, a sphere 50 of semiconducting material is inserted into a hole in the center conductor 51. By making the diameter of the sphere substantially equal to the diameter of the hole, the sphere comes in contact with the center conductor at all points along the outer periphery of the hole. A rectifying connection is then made between the sphere and the center conductor along a continuous ring around the sphere. Electrical connection is made between the sphere and the ground conductors 52 and 53 by means of cylindrical posts 54 and 55 which are in nonrectifying contact with sphere 50.

It is apparent that the embodiments of FIGS. 9A, 9B and 10 represent extreme situations. In FIGS. 9A and 9B a single point connection is made between the center conductor and the diode. In FIG. 10 contact is made along a continuous ring or the equivalent of an infinite number of points. Thus, by suitably selecting the geometries of the hole and the semiconductor any number of point connections can be made. For example, if a square hole 56 is used with a sphere 57 whose diameter is equal to a side of the hole, as shown in FIG. 11, four rectifying connections 58 can be made. In this manner the inductance (and resistance) of the diode can be more readily controlled.

FIG. 12 is illustrative of another embodiment of the invention utilizing two diodes 60 and 61 symmetrically connected to the center conductor 62. This arrangement takes advantage of the extremely low inductance obtained for the balanced, symmetrical post arrangement of FIG. 8. Here, each diode is connected in a balanced manner to the two ground conductors 63 and 64 and, in addition, by mounting one diode on each side of the center conductor 62, a symmetrical structure obtains.

The various embodiments of the invention described above can be used wherever a low inductance mounting is required which will not terminate the line. A simple illustration of such a use is given in FIG. 13 in which a tunnel diode 70 is used in conjunction with a movable short 71 as a variable frequency oscillator. Biasing means are also shown connected between the transverse post 72 (which is conductively insulated from the ground conductors 73 and 74) and center conductor 75.

In all cases, it is understood that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. In a balanced strip transmission line comprising a conductively continuous center conductor and two outer conductors;

a circuit element having a pair of terminals;

one terminal of said element being electrically connected to said center conductor;

and the other terminal of said element being electrically connected to each of said outer conductors by means of a transversely extending post.

2. The combination according to claim 1;

wherein said center conductor has a hole therein;

wherein said element is located within said hole;

and said post extends between said outer conductors through said hole.

3. In a balanced strip transmission line comprising a conductively continuous center conductor and two outer ground conductors;

a diode having a rectifying barrier;

means for connecting one side of said rectifying barrier to the center conductor;

and means for connecting the other side of said rectifying barrier to each of the ground conductors by means of posts extending transversely across said line.

4. In a balanced strip transmission line comprising a conductively continuous center conductor having a hole therein and two outer ground conductors;

a diode having a rectifying barrier mounted within said hole;

means for connecting one side of said diode to said center conductor;

and means for connecting the other side of said diode to said ground conductors by means of posts extending transversely across said line.

5. The combination according to claim 4;

wherein said hole has its center along the longitudinal axis of said guide.

6. The combination according to claim 4;

wherein said hole is circular and said diode comprises a sphere of semiconductor material whose diameter is substantially equal to the diameter of said hole;

and wherein said sphere is located within said hole and makes a rectifying connection with said center conductor along a continuous ring about the periphery of said hole.

7. The combination according to claim 4;

wherein said hole is square and said diode comprises a sphere of semiconductor material whose diameter is substantially equal to a side of said hole;

and wherein said sphere is located within said hole and makes a rectifying connection with said center conductor at a point along each side of said hole.

8. In a balanced strip transmission line comprising a flat, planar center conductor and two outer ground conductors;

a pair of two terminal circuit elements mounted at transversely opposite edges of said center conductor;

each of said elements having one terminal electrically connected to said center conductor;

and means extending transversely across said line for electrically connecting the other terminal of each of said elements to both of said ground conductors.

9. In a balanced strip transmission line comprising a conductively continuous center conductor and a pair of outer conductors;

a diode having a rectifying barrier;

means for connecting one side of said rectifying barrier to the center conductor of said line;

means extending transversely across said line for connecting the other side of said rectifying barrier to said outer conductors;

and a shorting piston longitudinally displaced from said diode for terminating said line.

10. In a balanced strip transmission line comprising a center conductor having a hole therein and a pair of outer conductors;

a diode having a rectifying barrier mounted within said hole;

means for electrically connecting one side of said rectifying barrier to said center conductor;

a metallic post connected to the other side of said rectifying barrier;

said post passing through said hole and extending transversely across said line;

and a screw mounted in each of said outer conductors for contacting opposite ends of said post.

11. The combination according to claim 10;

wherein said screw is tipped with a soft metal;

and wherein said post is imbedded in said metal.

References Cited by the Examiner

UNITED STATES PATENTS

| | | | |
|---|---|---|---|
| 2,934,723 | 4/60 | Hewitt | 333—84 |
| 2,964,718 | 12/60 | Packard | 333—82 |
| 2,977,484 | 3/61 | Sterzer | 328—92 |
| 3,111,634 | 11/63 | Ammerman | 333—84 |
| 3,117,379 | 1/64 | Ayer | 333—84 |
| 3,155,881 | 11/64 | St. Jean | 333—1 |

HERMAN KARL SAALBACH, *Primary Examiner.*